United States Patent [19]
Richter et al.

[11] Patent Number: 6,158,029
[45] Date of Patent: Dec. 5, 2000

[54] METHOD OF TESTING AN INTEGRATED CIRCUIT HAVING A MEMORY AND A TEST CIRCUIT

[75] Inventors: Detlev Richter; Roland Weigand, both of München, Germany

[73] Assignee: Infineon Technologies AG, Munich, Germany

[21] Appl. No.: 09/395,320

[22] Filed: Sep. 13, 1999

Related U.S. Application Data

[63] Continuation of application No. PCT/DE98/00479, Feb. 17, 1998.

[51] Int. Cl.[7] .................... G11C 29/00; G01R 31/28
[52] U.S. Cl. ................... 714/718; 714/724; 365/201
[58] Field of Search .................... 714/724, 718, 714/733, 728, 738; 365/189.04, 189.05, 201, 222, 233, 189.03, 191

[56] References Cited

U.S. PATENT DOCUMENTS

| | | | |
|---|---|---|---|
| 4,701,918 | 10/1987 | Nakajima et al. | 714/724 |
| 5,115,191 | 5/1992 | Yoshimori | 714/724 |
| 5,351,211 | 9/1994 | Higeta et al. | 365/189.05 |
| 5,502,677 | 3/1996 | Takahashi | 365/201 |
| 5,757,705 | 5/1998 | Manning | 365/201 |

FOREIGN PATENT DOCUMENTS

| | | |
|---|---|---|
| 0 053 665 A1 | 6/1982 | European Pat. Off. |
| 0 213 037 A2 | 3/1987 | European Pat. Off. |
| 0 337 106 A2 | 10/1989 | European Pat. Off. |
| 42 06 344 C2 | 4/1993 | Germany. |

*Primary Examiner*—Emmanuel L. Moise
*Attorney, Agent, or Firm*—Herbert L. Lerner; Laurence A. Greenberg; Werner H. Stemer

[57] ABSTRACT

The memory can be tested by the test circuit and is connected to the latter via data lines, address lines, and control lines. At least one of the control lines is connected via a controlled switching device. The switching device can be controlled via an external terminal of the integrated circuit, with the result that the signal characteristic on the corresponding line and thus the timing of the test can be influenced externally. The invention is particularly suitable for implementing self-tests of embedded memory cores.

1 Claim, 1 Drawing Sheet

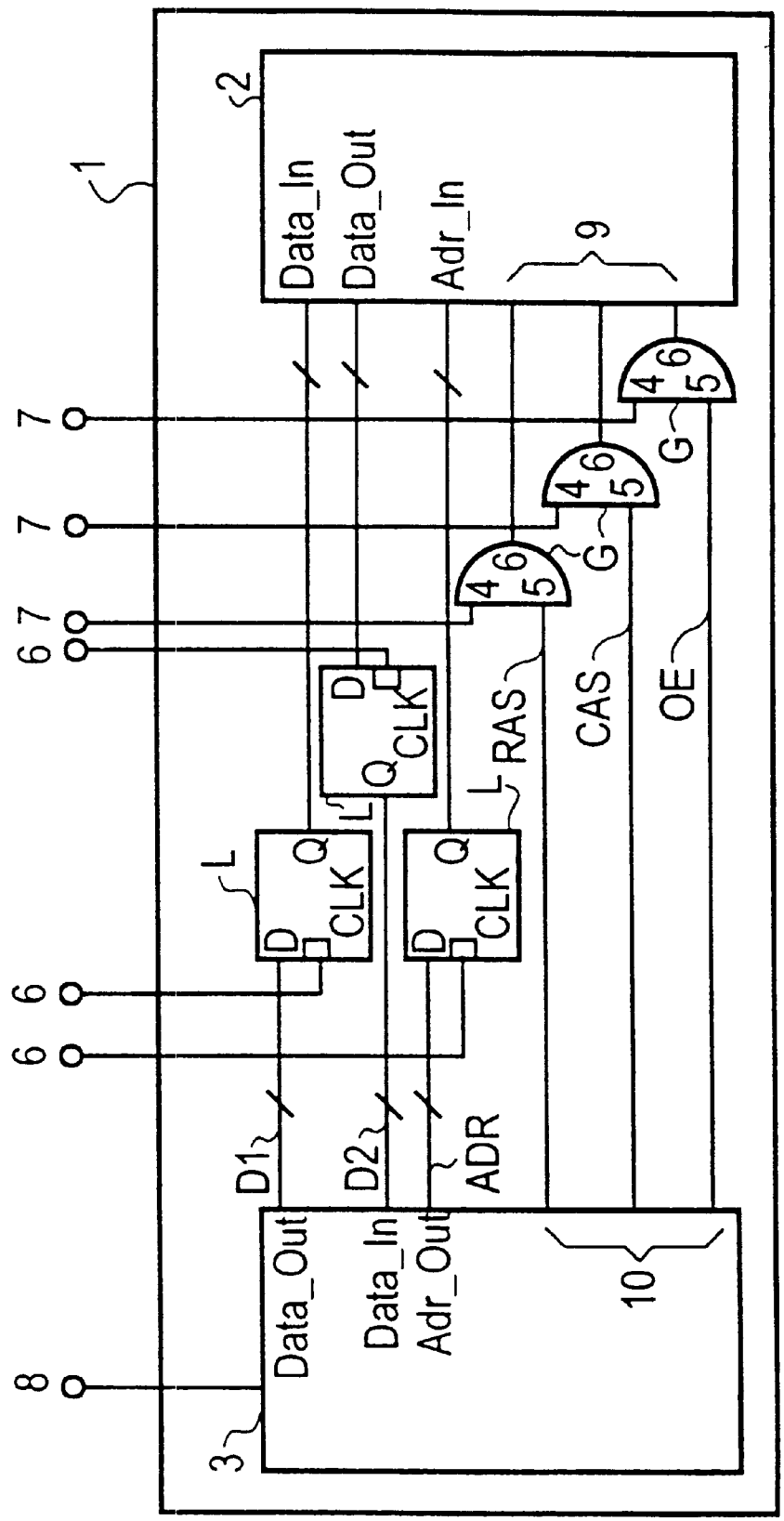

METHOD OF TESTING AN INTEGRATED CIRCUIT HAVING A MEMORY AND A TEST CIRCUIT

CROSS-REFERENCE TO RELATED APPLICATION

This is a continuation of copending International Application PCT/DE98/00479, filed Feb. 17, 1998, which designated the United States.

BACKGROUND OF THE INVENTION

Field of the Invention

The invention lies in the field of semiconductor technology. More specifically, the invention pertains to a method of testing an integrated circuit equipped with a memory and a test circuit.

In addition to logic circuits, use is increasingly being made of so-called embedded memory cores in integrated circuits. Such memories are used to store data that arise from inside the integrated circuit or are required by the latter. It is thereby not necessary for the functioning of the integrated circuit to access the memory from outside the integrated circuit. Testing of the operability of the memory is necessary, nevertheless. An extensive test requires both that the addresses and data patterns be generated algorithmically and applied to terminals of the memory, and that the time response of the applied addresses, the data to be stored, and the control signals be changed.

In order to carry out a test of a memory core, it can be provided to connect all the terminals of the memory to external terminals of the integrated circuit, at least while it is being tested (so-called release). However, this requires a large number of external terminals and the presence of a memory tester for connection to the external terminals, which generates the required algorithmic test patterns.

A further possibility for carrying out the functional testing of the memory is the so-called Built-In Self Test (BIST). Testing the memory is undertaken by a test circuit, which is provided on the integrated circuit, generates the test patterns and also fixes the timing of the corresponding signals. It is impossible in this case to influence the testing from outside the integrated circuit. After the self test has been carried out completely, all that is then required is to transmit a single result signal (Go-/No-Go signal) to outside the integrated circuit, for which purpose a single test signal output suffices in the extreme case. By contrast with the first mentioned solution, this one does have the advantage of avoiding a large number of test pins and of managing without an external test device with a large number of test terminals. However, a BIST has the disadvantage that thorough testing requires a large number of different test patterns and time responses to be generated by the test circuit located on the integrated circuit.

A large outlay is required in order to be able to undertake a variation in the timing in the case of a BIST. This requires, inter alia, timing generators in the corresponding test circuit (for example in the form of ring counters) and comparators. This additional outlay on circuitry weighs very heavily particularly in the case of memories to be tested which have a low storage capacity.

A memory which is connected to an internal test circuit via a circuit configuration is described in European patent application EP 0 213 037 A. The circuit configuration is controlled from outside and connects the memory to the test circuit in a test mode, while it connects the memory to external terminals in a normal mode.

An integrated circuit having a memory and a test device is specified in European patent application EP 0 053 665 A. The test device feeds data and addresses to the memory via gates controlled from outside the integrated circuit. Control signals are fed directly to the memory from outside the integrated circuit.

SUMMARY OF THE INVENTION

It is accordingly an object of the invention to provide a method of testing an integrated circuit with a memory and a test circuit, which overcomes the above-mentioned disadvantages of the heretofore-known devices and methods of this general type and which allows testing of an embedded memory core of an integrated circuit in which the timing is varied in a simple way during the memory test.

With the foregoing and other objects in view there is provided, in accordance with the invention, a method of testing an integrated circuit having a memory and a test circuit connected to the memory via data lines, address lines, and control lines;

a switching device is connected in at least one of the control lines between the testing device and the memory, such that a signal impressed on that control line during a testing operation is received at an input of the switching device and cannot be transferred to an output of the switching device until the switching device switches through; and whereby the switching device has a control input for causing the switching device to switch through, and the control input is connected to an external terminal of the integrated circuit.

The method comprises the following steps:

testing the memory with the test circuit by impressing with the test circuit appropriate test signals on the data lines, address lines, and control lines; and during the testing step, influencing a signal characteristic on the corresponding control line, and a resultant timing of the test, via the external terminal of the circuit.

In other words, in order to carry out the memory test, the memory and the test circuit of the integrated circuit are interconnected via data lines, address lines and control lines. The switching device can be switched through by applying a signal to the external terminal. The signal characteristic on the corresponding line can therefore be influenced, with the result that the timing of the test can be influenced. The invention offers the advantage that a less expensive BIST can be carried out on the integrated circuit, while it is possible at the same time to vary the timing via the switching device.

In a first embodiment of the invention, the switching device is a logic gate, for example an AND gate. One of the inputs of the logic gate is the control input.

In another embodiment, the switching device is a latch having a clock input which is the control input.

It is particularly favorable when several of the data lines and/or address lines form a data bus and/or address bus, all the lines of the respective bus are led via one switching device each, and all the control inputs of the switching device of each bus are connected to in each case the same external terminal of the integrated circuit. The result of this is to be able to influence the timing effectively in conjunction with simultaneously minimizing the number of external terminals required for the test.

Other features which are considered as characteristic for the invention are set forth in the appended claims.

Although the invention is illustrated and described herein as embodied in a method of testing an integrated circuit having a memory and a test circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a schematic block diagram of an integrated circuit device.

DESCRIPTION OF THE PREFERRED EMBODIMENTS

Referring now to the sole FIGURE of the drawing in detail, there is seen an integrated circuit 1, which has a memory 2 in the form of an embedded memory core and a test circuit 3, which serves to carry out a test of the memory 2. In order to enable the memory test to be carried out, the memory 2 and the test circuit 3 are interconnected via the following lines:

- an address bus ADR for applying addresses, generated by the test circuit 3, to the memory 2 in order to address memory locations of the memory 2;
- a first data bus D1, via which data to be input can be transferred from the test circuit 3 to the memory 2;
- a second data bus D2, via which data to be read out can be transferred from the memory 2 to the test circuit 3 (in other exemplary embodiments of the invention, it is also possible, of course, to provide a single, bidirectional data bus);
- control lines RAS, CAS, OE, via which corresponding control signals, required to control the respective memory can be transferred from outputs 10 of the test circuit 3 to corresponding inputs 9 of the memory 2.

In the exemplary embodiment under consideration, the memory 2 is a DRAM. Accordingly, one of the control signals is a row selection signal RAS, a further one is a column selection signal CAS and a third is an output-enable signal OE. In other embodiments of the invention, this can also be a write-enable signal WE.

It is possible via the lines described for arbitrary test patterns generated by the test circuit 3 to be input into the memory 2 and read out again from the latter. As a result of the testing of the memory 2, after termination of the test, the test circuit 3 transmits a corresponding result signal to a third external terminal 8 of the integrated circuit 1.

In addition, the integrated circuit 1 has a switching device L, G via which one of the lines D1, D2, ADR, PAS, CAS and OE shown is led in each case in the exemplary embodiment shown. In the exemplary embodiment shown, the data lines D1, D2 and the address lines ADR are led via latches L sensitive to clock level, as the switching device. Latches can be switched into a transparent state and an opaque (non-transparent) state. If they are opaque, a signal change at their input D has no effect on their output Q. By applying an appropriate level to a clock input CLK of the latches L, they can be switched to be transparent, with the result that a signal at the input D is also -present at the output Q. According to the invention, the clock inputs CLK of the latches L are connected to first external terminals 6.

In the exemplary embodiment, each of the data lines of the first data bus D1 and of the second data bus D2, as well as each of the address lines of the address bus ADR is led via one latch L each. All the clock inputs CLK of the latch L of the same bus D1, D2, ADR are, however, advantageously connected to in each case the same first terminal 6 of the integrated circuit 1. It is now possible via the first external terminals 6 to delay the timing of the signals generated by the test circuit 3 or of the signals read out from the memory 2, by switching the appropriate latch L to be transparent at an arbitrary instant.

The control lines RAS, CAS, OE are led via other switching device, specifically logic gates G in the form of AND-Gates. In this arrangement, an input 4 of each of the gates G is connected in each case to a second external terminal 7 of the integrated circuit 1. It is possible via the second external terminals 7 to cause a change in the level of the control signals RAS, CAS, OE only later at the output of the respective gate G.

The switching means L, G according to the invention can be used to influence the entire timing via only a few external terminals 6, 7 of the integrated circuit 1 during testing of the memory 2 by the test circuit 3. To generate appropriate signals for the external terminals 6, 7, a non-illustrated test device is required which has only a few output terminals, the number of which can be substantially less than that of the terminals of the memory 2. This can be, for example, a simple logic tester without memory test devices, since generating the addresses of the write data and comparing the read data on the integrated circuit 1 are carried out by the test circuit 3 on the integrated circuit 1. The small number of external test terminals (instead of the up to 40 terminals which would be required in the case of the complete release of the memory 2 to the terminals of the integrated circuit) permits parallel testing of a plurality of chips simultaneously in a simple way. It is possible to carry out a detailed analysis of the memory, without all its data inputs and data outputs, address terminals and control signals being connected in each case to an external terminal of the integrated circuit 1.

Thus, while, in the case of the outlined exemplary embodiment of the invention, the test patterns are being generated by the test circuit and the data read out are also being tested by the test circuit 3, the timing of the signals can be influenced from outside the integrated circuit via the external terminals 6, 7. It is particularly advantageous that only one external test terminal 6 is required in each case for a complete data bus or address bus. It is possible, for example, to vary the length of a memory cycle or to vary the access time to be tested via the external terminals 6, 7.

The test circuit 3 used to generate the test patterns and to evaluate the data read out can either be implemented as a test generator (hardware solution) or be implemented as test software by the processor or microcontroller, which is mostly present in any case on the integrated circuit.

It is also possible in each case to provide as a switching means for influencing the timing on the lines connecting the memory 2 and the test circuit 3 a field effect transistor or a transmission gate (which can, for example, be implemented by two parallel-connected field effect transistors of opposite channel type, which can be driven by inverted signals), whose control gate is connected to an external terminal of the integrated circuit 1. Flip-flops controlled by clock edge can also be used instead of the latches L shown in the FIGURE.

The invention has the further advantage that the test sequence, which is generally stipulated in a BIST by the test circuit 3, can still be influenced subsequently with reference to its time response via the external terminals 6, 7. The outlay for varying the timing of the signals during testing by the test circuit 3 can thus be reduced by the invention.

We claim:

1. A method of testing an integrated circuit having a memory, an external terminal, and a test circuit connected to the memory through data lines, address lines, and control lines, which comprises:

providing a switching device with inputs, outputs, and a control input for causing the switching device to switch through;

connecting at least one of the control lines to the switching device such that a signal impressed on the at least one of the control lines during a testing operation is received at an input of the switching device and cannot be transferred to an output of the switching device until the switching device switches through;

connecting the control input to an external terminal of the integrated circuit;

testing the memory with the test circuit by impressing with the test circuit appropriate test signals on the data lines, address lines, and control lines; and during the testing step, influencing a signal characteristic on the corresponding control line, and a resultant timing of the test, through the external terminal of the circuit.

\* \* \* \* \*